US005973504A

United States Patent [19]

Chong

[11] Patent Number: 5,973,504

[45] Date of Patent: Oct. 26, 1999

[54] PROGRAMMABLE HIGH-DENSITY ELECTRONIC DEVICE TESTING

[75] Inventor: Fu Chiung Chong, Saratoga, Calif.

[73] Assignee: Kulicke & Soffa Industries, Inc., Willow Grove, Pa.

[21] Appl. No.: 08/925,369

[22] Filed: Sep. 8, 1997

Related U.S. Application Data

[63] Continuation of application No. 08/645,184, May 13, 1996, abandoned, which is a continuation of application No. 08/331,055, Oct. 28, 1994, abandoned.

[51] Int. Cl.[6] .......... G01R 31/02

[52] U.S. Cl. .......... 324/754

[58] Field of Search .......... 324/158.1, 73.1, 324/72.5, 754, 761, 762, 755; 439/482; 371/15.1, 25.1; 438/14, 17

[56] References Cited

U.S. PATENT DOCUMENTS

| | | | |
|---|---|---|---|
| 3,516,077 | 6/1970 | Bobeck et al. | 340/174 |
| 3,577,131 | 5/1971 | Morrow et al. | 340/174 |
| 3,673,433 | 6/1972 | Kupfer | 307/247 A |
| 3,934,236 | 1/1976 | Aiken et al. | 340/174 TF |
| 4,021,790 | 5/1977 | Aiken et al. | 340/174 TF |
| 4,117,543 | 9/1978 | Minnick et al. | 365/5 |
| 4,646,299 | 2/1987 | Schinabeck et al. | 324/73.1 |
| 4,692,839 | 9/1987 | Lee et al. | 361/386 |
| 4,729,166 | 3/1988 | Lee et al. | 29/877 |

(List continued on next page.)

FOREIGN PATENT DOCUMENTS

| | | |
|---|---|---|
| 0 298 219 | 1/1989 | European Pat. Off. . |
| 0 361 779 | 4/1990 | European Pat. Off. . |
| 0 388 790 | 9/1990 | European Pat. Off. . |
| W/O 88 05544 | 7/1988 | WIPO . |

OTHER PUBLICATIONS

Fisher et al, "Reducing Test Costs for High–Speed and High Pin–Count Devices", *Probe Technology*, Feb. 1992; Santa Clara, CA.

Fresh Quest Corporation, "Fresh Quest Corporation Announces the Deliver of QC²™ Bare Die Carriers and QPC™ Probe Cards for the Production of Known Good Die"; Chandler, AZ (Jul. 1, 1994).

Hewlett Packard, "High Speed Wafer Probing with the HP 83000 Model F660"; 1993; Germany.

Packard Hughes Interconnect, "Science Over Art, Our New IC Membrane Test Probe"; 1993; Irvine, CA.

Packard Hughes Interconnect, "Our New IC Membrane Test Probe. It's Priced the Same, But It Costs Less.", Irvine, CA; 1993.

*Primary Examiner*—Vinh P. Nguyen
*Attorney, Agent, or Firm*—Fish & Richardson P.C.

[57] ABSTRACT

Generally, in one aspect, apparatus features a structure for routing test signals between pads of a device under test and a tester circuit. The structure features a probe support that includes a substrate having contact points, one for each of the pads to be tested, a number of conductors for connection to the tester circuit, the number of conductors being fewer than the number of contact points on the substrate, and switching circuitry mounted on the probe support for routing the test signals between the conductors and the contact points. In another aspect, a method routes test signals between pads of a device under test and terminals of a tester circuit, the method features providing a test head in the vicinity of the device under test, the test head having a contact for each pad to be tested on the device under test and a separate conductor connecting each contact to a switching circuit located on the test head, passing test signals between the pads of the device under test and the switching circuit via the conductors, and passing test signals between the switching circuit and the terminals of the tester via wires that number fewer than half of the number of conductors on the test head.

8 Claims, 14 Drawing Sheets

U.S. PATENT DOCUMENTS

| | | | |
|---|---|---|---|
| 4,754,546 | 7/1988 | Lee et al. | 29/877 |
| 4,757,256 | 7/1988 | Whann et al. | 324/158 |
| 4,758,785 | 7/1988 | Rath | 324/754 |
| 4,778,950 | 10/1988 | Lee et al. | 174/356 C |
| 4,804,132 | 2/1989 | DeFrancesco | 228/115 |
| 4,912,399 | 3/1990 | Greub et al. | 324/158 |
| 4,918,383 | 4/1990 | Huff et al. | 324/158 F |
| 4,922,192 | 5/1990 | Gross et al. | 324/72.5 |
| 4,954,873 | 9/1990 | Lee et al. | 357/72 |
| 4,975,638 | 12/1990 | Evans et al. | 324/158 P |
| 4,980,637 | 12/1990 | Huff et al. | 324/158 P |
| 5,020,219 | 6/1991 | Leedy | 324/754 |
| 5,072,176 | 12/1991 | Miller et al. | 324/537 |
| 5,083,697 | 1/1992 | Difrancesco | 228/116 |
| 5,103,557 | 4/1992 | Leedy | 324/754 |
| 5,132,613 | 7/1992 | Papae et al. | 324/158 |
| 5,180,977 | 1/1993 | Huff | 324/158 P |
| 5,264,787 | 11/1993 | Woith et al. | 324/158 P |
| 5,323,107 | 6/1994 | D'Souza | 324/754 |
| 5,355,079 | 10/1994 | Evans et al. | 324/754 |
| 5,378,982 | 1/1995 | Feigenbaum et al. | 324/770 |
| 5,416,429 | 5/1995 | McQuade et al. | 324/762 |
| 5,422,574 | 6/1995 | Kister | 324/754 |
| 5,434,513 | 7/1995 | Fujii et al. | 324/754 |
| 5,456,404 | 10/1995 | Robinette et al. | 228/104 |
| 5,468,157 | 11/1995 | Roebuck et al. | 439/264 |
| 5,469,072 | 11/1995 | Williams et al. | 324/754 |
| 5,491,427 | 2/1996 | Ueno et al. | 324/754 |

PROGRAMMABLE HIGH-DENSITY ELECTRONIC DEVICE TESTING

This is a continuation of application Ser. No. 08/645,184, filed May 13, 1996, now abandoned, which is a continuation of Ser. No. 08/331,055, filed Oct. 28, 1994, now abandoned.

BACKGROUND

This invention relates to high-density electronic device testing.

Testing of electronic circuits has been made much more difficult by two developments. First, manufacturers are placing more electronic components on a single integrated circuit substrate (IC). Second, multiple discrete ICs are being combined on printed wiring boards (PWBs) and multi-chip module substrates (MCMs) of ever smaller dimensions. MCMs typically include several ICs attached to a substrate. Etched interconnection wiring paths link nodes (e.g., terminals or pads) of one IC to another.

Testing of ICs may be done in situ on a semiconductor wafer, after the ICs are separated into individual dies, or after they are assembled onto PWBs or MCM substrates. The MCM substrates and PWBs may also be tested before ICs are mounted on them.

Continual miniaturization challenges existing testing equipment. One type of test performed on devices measures the integrity of node-to-node interconnections (called "nets"). The effectiveness of such testing is typically described by the number of tests per second (the speed), based on the smallest inter-node distance the measurement probe can safely access (the test probe size). As the number of nets goes up and the inter-node distance goes down, testing methods must provide higher speeds and a smaller test probe size to remain effective and cost-competitive.

One established testing method employs a so-called "bed of nails" tester, comprising an array of electrical contact points. During tests, the contact array simultaneously strikes a corresponding array of nodes. Testing of a PWB or MCM substrate for electrical continuity and shorts using a bed of nails tester proceeds rapidly in parallel, with many nodes being tested at the same time. But the size of bed of nails testers cannot be reduced indefinitely as circuit size shrinks.

Another testing method uses only one or a few probes that are rapidly moved from node to node across the circuit substrate, testing individual nodes (or small groups of nodes) serially. Testing speeds for such probe testers are limited by the velocity of the mechanical stage that holds the circuit substrate, or the probe, to a few tests per second, but research may extend this speed to 30 to 50 tests per second. One approach employs a multi-probe array (with, for example, two probe testers) that increases testing speed by performing more than one test at a time.

Researchers are also exploring the use of a focused beam of electrons to test circuit substrates. A rapidly moving electron beam alternately charges and then senses the voltage on individual circuit nets, all within a high vacuum.

SUMMARY

Generally, in one aspect, the invention features a structure for routing test signals between pads of a device under test and a tester circuit. The structure comprises a probe support that includes a substrate having contact points, one for each of the pads to be tested, a number of conductors for connection to the tester circuit, the number of conductors being fewer than the number of contact points on the substrate, and switching circuitry mounted on the probe support for routing the test signals between the conductors and the contact points.

Implementations of the invention may include the following features. The switching circuitry can comprise an integrated circuit, or a multichip module including integrated circuits. The substrate can comprise a flexible membrane and the switching circuitry can comprise at least one multichip module attached to the flexible membrane. The flexible membrane can be generally rectangular, and can have a frame enclosing an area where the contact points are located. The flexible membrane can connect to the switching circuitry through a second set of electrical contact points, and this second set of electrical contact points can comprise a membrane-to-thin-film electrical connection. Further, the switching circuitry can connect to the testing circuit through a third set of electrical contact points. The switching circuitry can comprise a plurality of control chips, each control chip comprising a control logic block and a plurality of I/O pin logic blocks. Each I/O pin logic block can comprise a Sense__Pins logic block and a Force__Pins logic block. And each I/O pin logic block can comprise an In__Pins logic block, an Out__Pins logic block and I/O Decode logic block.

In another aspect, the invention features a structure for routing test signals between pads of a device under test and a tester circuit, comprising a probe support that includes a substrate having contact points, one for each of the pads to be tested, the substrate comprising a flexible membrane, a number of conductors for connection to the tester circuit, the number of conductors being fewer than the number of contact points on the substrate, and switching circuitry mounted on the probe support for routing the test signals between the conductors and the contact points, the switching circuitry comprising at least one multichip module attached to the flexible membrane, the flexible membrane connecting to the switching circuitry through a second set of electrical contact points, the switching circuitry connecting to the conductors through a third set of electrical contact points.

In another aspect, the invention features a structure for simultaneously testing identical devices under test, each device under test having a number of pads, the structure comprising a probe support that includes a substrate having plural identical sets of contact points, one set for each of the devices under test, one contact point for each pad to be tested, a number of conductors for connection to the tester circuit, the number of conductors being fewer than the number of contact points on the substrate, and switching circuitry mounted on the probe support for routing test signals between the conductors and the contact points.

In another aspect, the invention features a method for routing test signals between pads of a device under test and terminals of a tester circuit, the method comprising providing a test head in the vicinity of the device under test, the test head having a contact for each pad to be tested on the device under test and a separate conductor connecting each contact to a switching circuit located on the test head, passing test signals between the pads of the device under test and the switching circuit via the conductors, and passing test signals between the switching circuit and the terminals of the tester via wires that number fewer than half of the number of conductors on the test head.

Implementations of the invention can include the following. The tester can send signals to the switching circuit that set or unset latches within the switching circuit. The latches can each open or close a respective pass-through gate, each pass-through gate connecting one of the conductors to one of the wires. The tester can send signals to the switching circuit so that a test signal from one of the conductors is compared with a reference signal from one of the wires. The tester can send a voltage to one pad of a circuit net on the device under test, successively ground each other pad of the circuit net and measure the voltage at the first pad.

In another aspect, the invention features a method for routing test signals between pads of a device under test and terminals of a tester circuit, the method comprising providing a test head in the vicinity of the device under test, the test head having a contact for each pad to be tested on the device under test and a separate conductor connecting each contact to a switching circuit located on the test head, passing test signals between the pads of the device under test and the switching circuit via the conductors, and sending signals from the tester to the switching circuit that set or unset latches within the switching circuit, the latches each opening or closing a respective pass-through gate, each pass-through gate connecting one of the conductors to one of a set of wires that number fewer than half of the number of conductors on the test head, the wires connecting to the terminals of the tester circuit.

Advantages of the invention include the following. Highly flexible testing of a variety of devices is possible, including semiconductor circuits (either during manufacture on wafers or as separate chips), and interconnection substrates such as PWBs and MCMs. Flexible membrane contacts allow testing of very dense collections of electrical pads. The latches of the switching circuitry allow a relatively small number of testing connections to access a large number of pads. The switching circuitry also provides for passing a variety of different voltage supplies and references to each pad being tested. Since the switching circuitry is not constructed for only one logic family, or one semiconductor substrate, the proper voltage may be attached or referenced without changing circuitry. Also, since the switching circuitry passes connections from the pad being tested to the test controller, rather than buffering them, both digital and analog tests may be performed. Furthermore, the switching circuitry can be replicated on the test head, along with the electrical contact patterns, to test multiple identical circuits at the same time, using the same test vectors supplied by the test controller.

Other features and advantages of the present invention are apparent from the following description, and from the claims.

DESCRIPTION

Figure 4A:
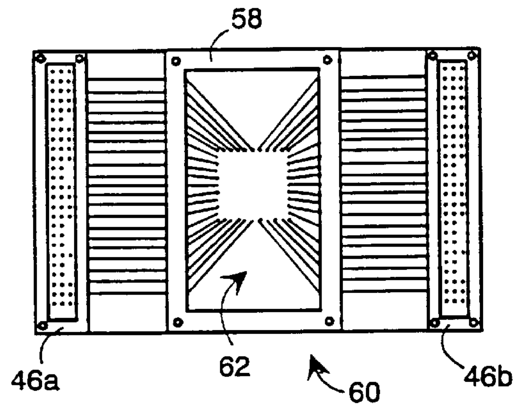
Figure 4B:
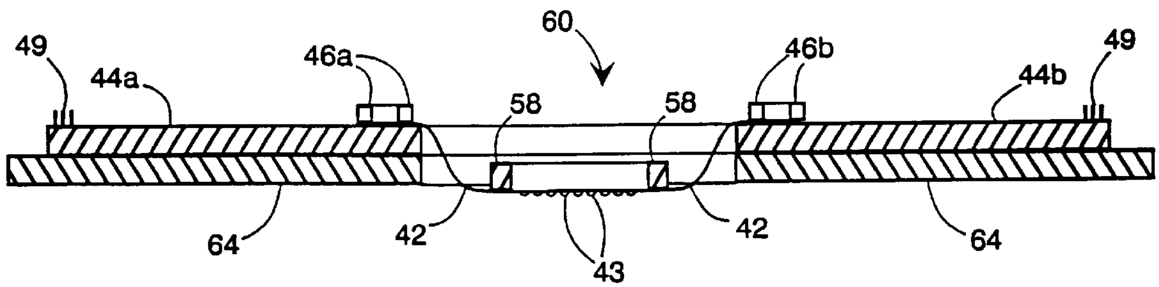

FIGS. 4*a* and 4*b* are top and sectional views of a membrane assembly (in FIG. 4*b*, mounted on the probe card).

Figure 5:
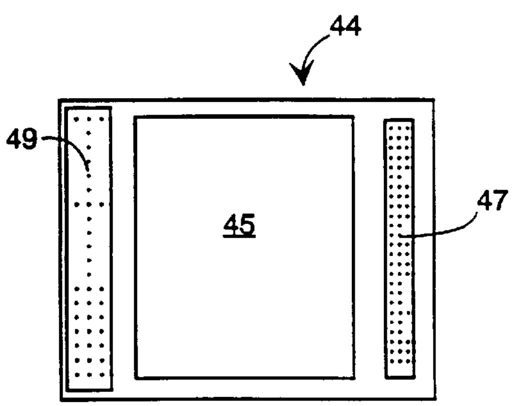

FIG. 5 is a top view of a switching circuit of the membrane probe card.

Figure 6:
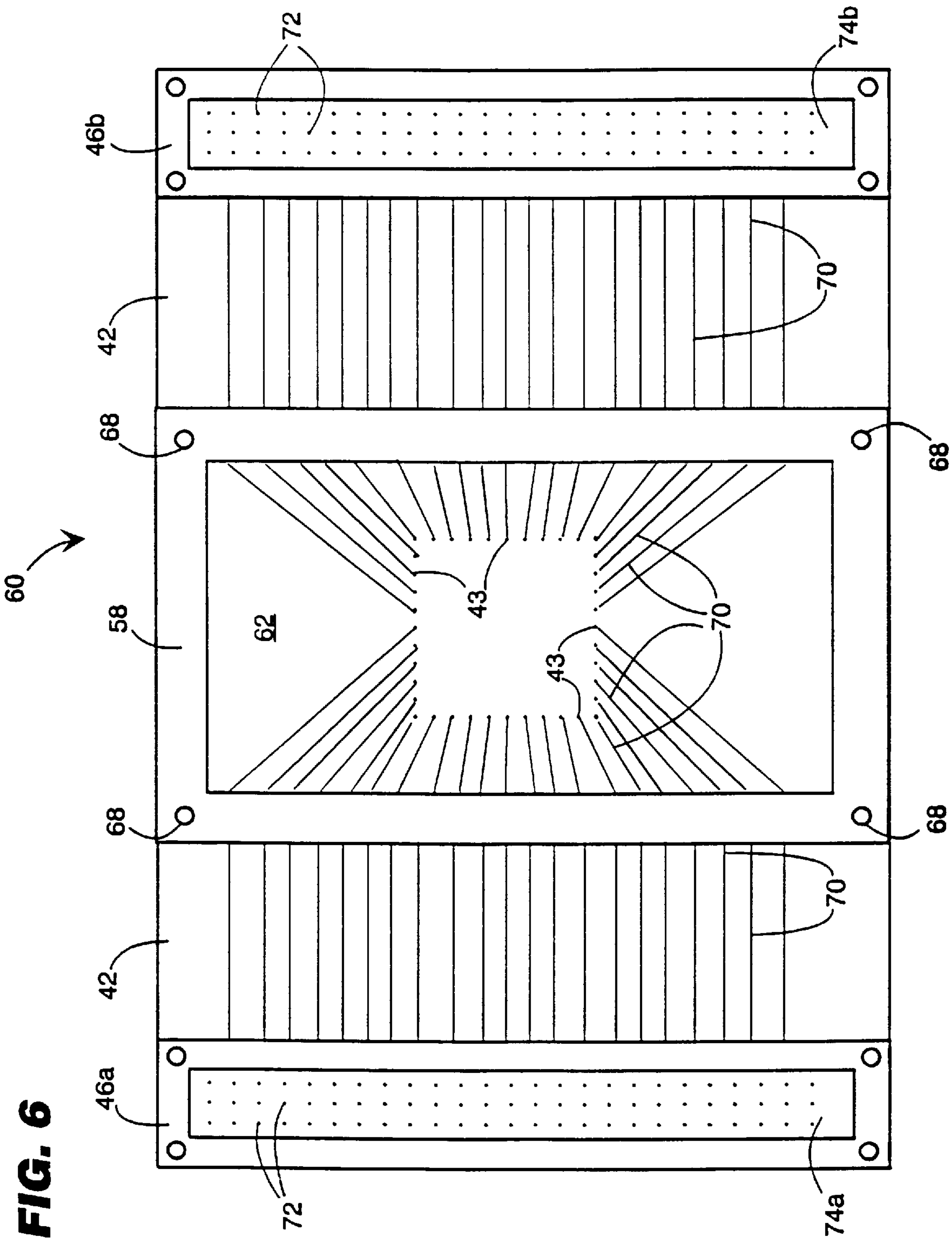

FIG. 6 is an expanded top view of the membrane assembly.

Figure 7:
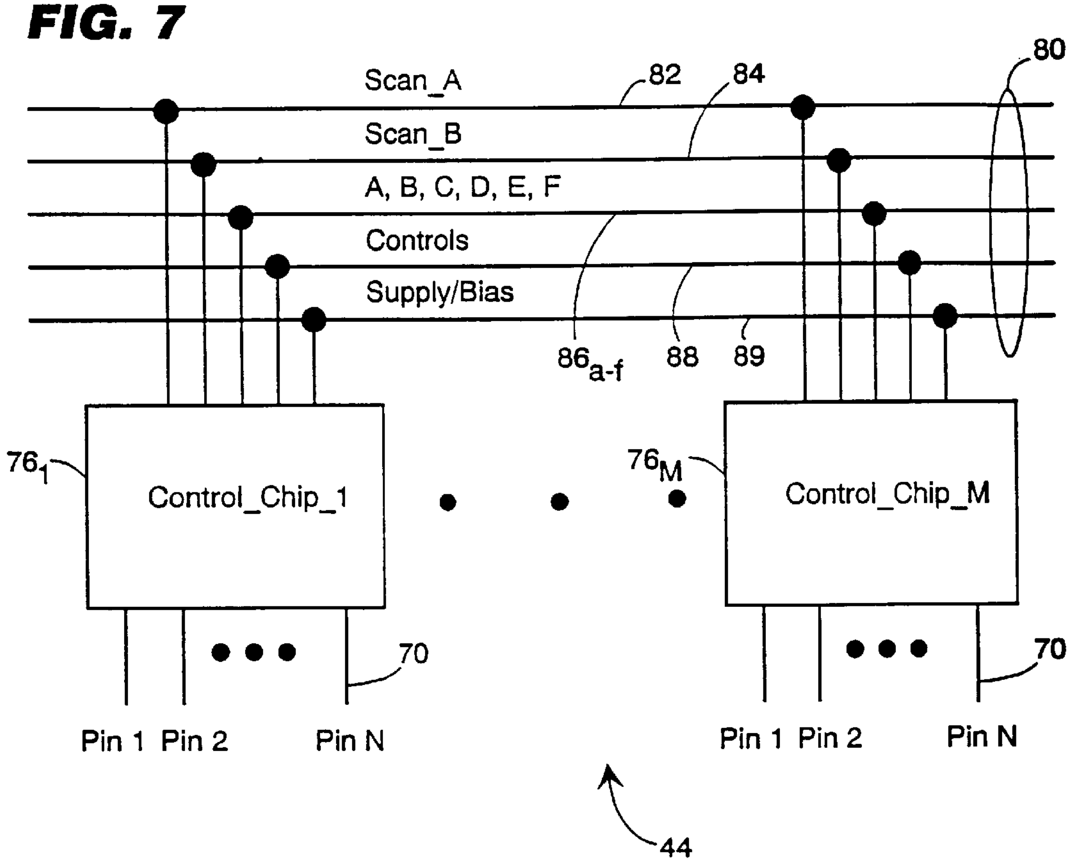

FIG. 7 is a schematic diagram of the switching circuit.

Figure 8:
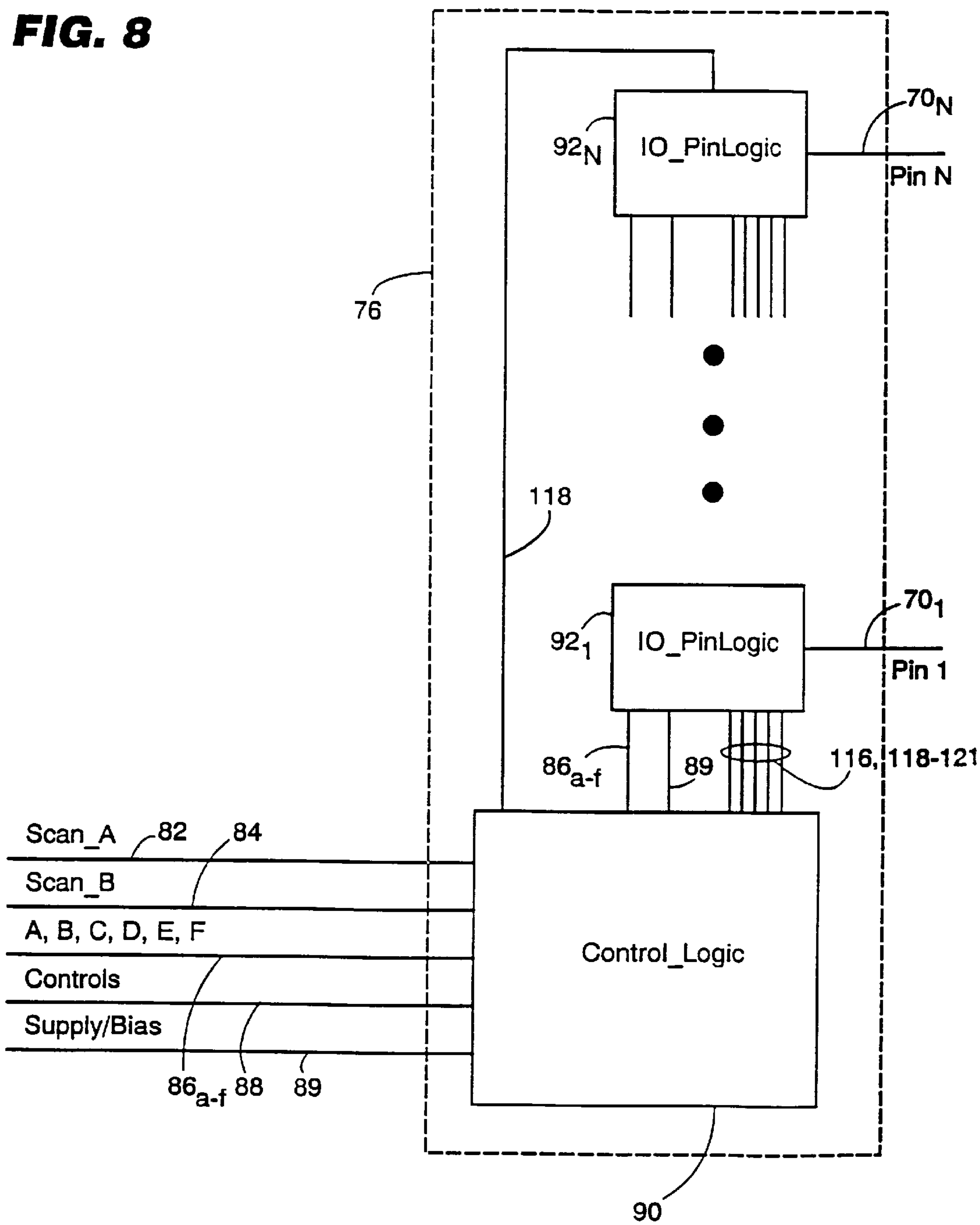

FIG. 8 is a schematic diagram of a control_chip block of the switching circuit.

Figure 9:
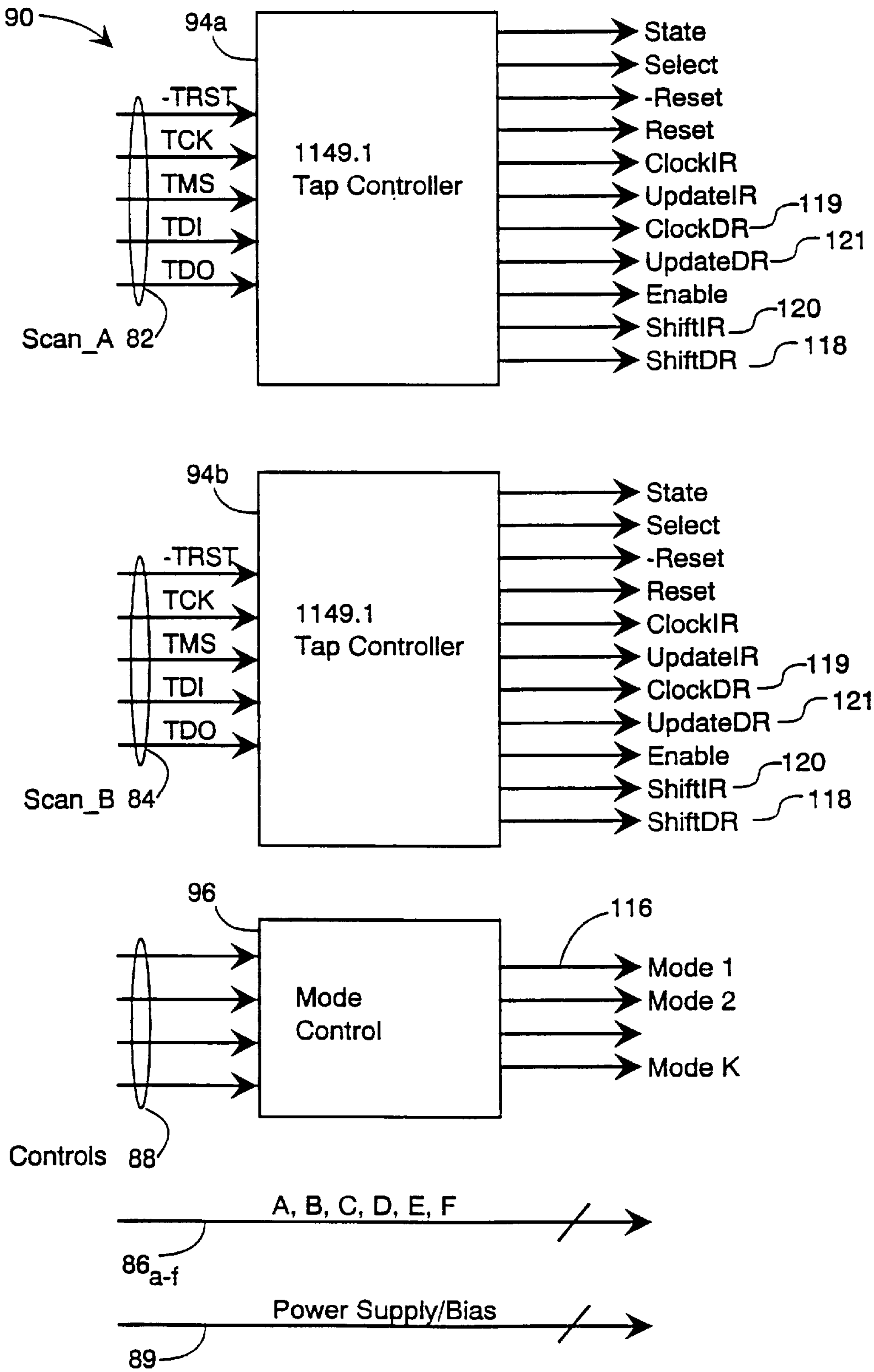

FIG. 9 is a schematic diagram of a Control_Logic circuit of the control_chip block.

Figure 10:
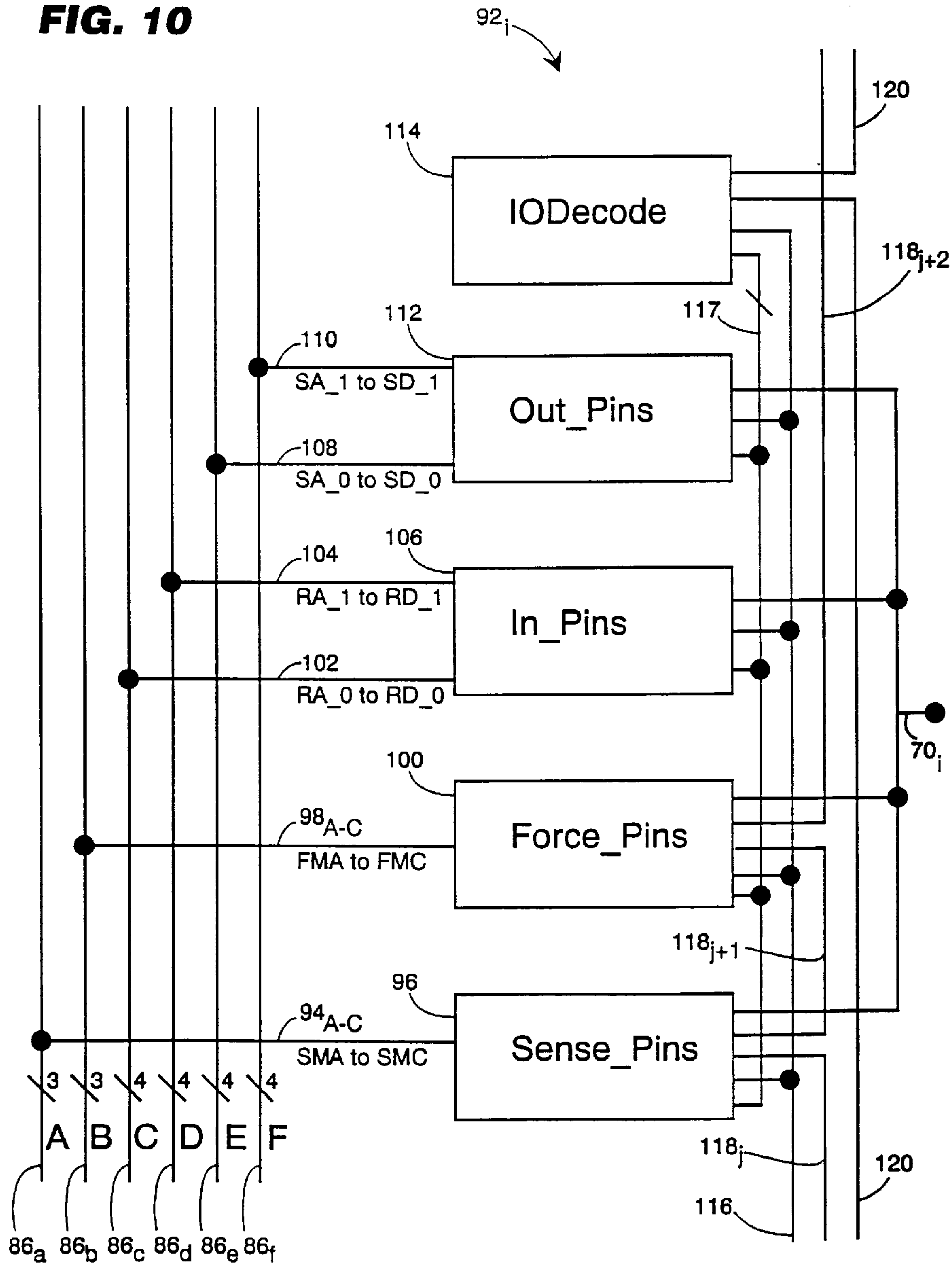

FIG. 10 is a schematic diagram of an I/O Pin Logic circuit of the control_chip block.

Figure 11:
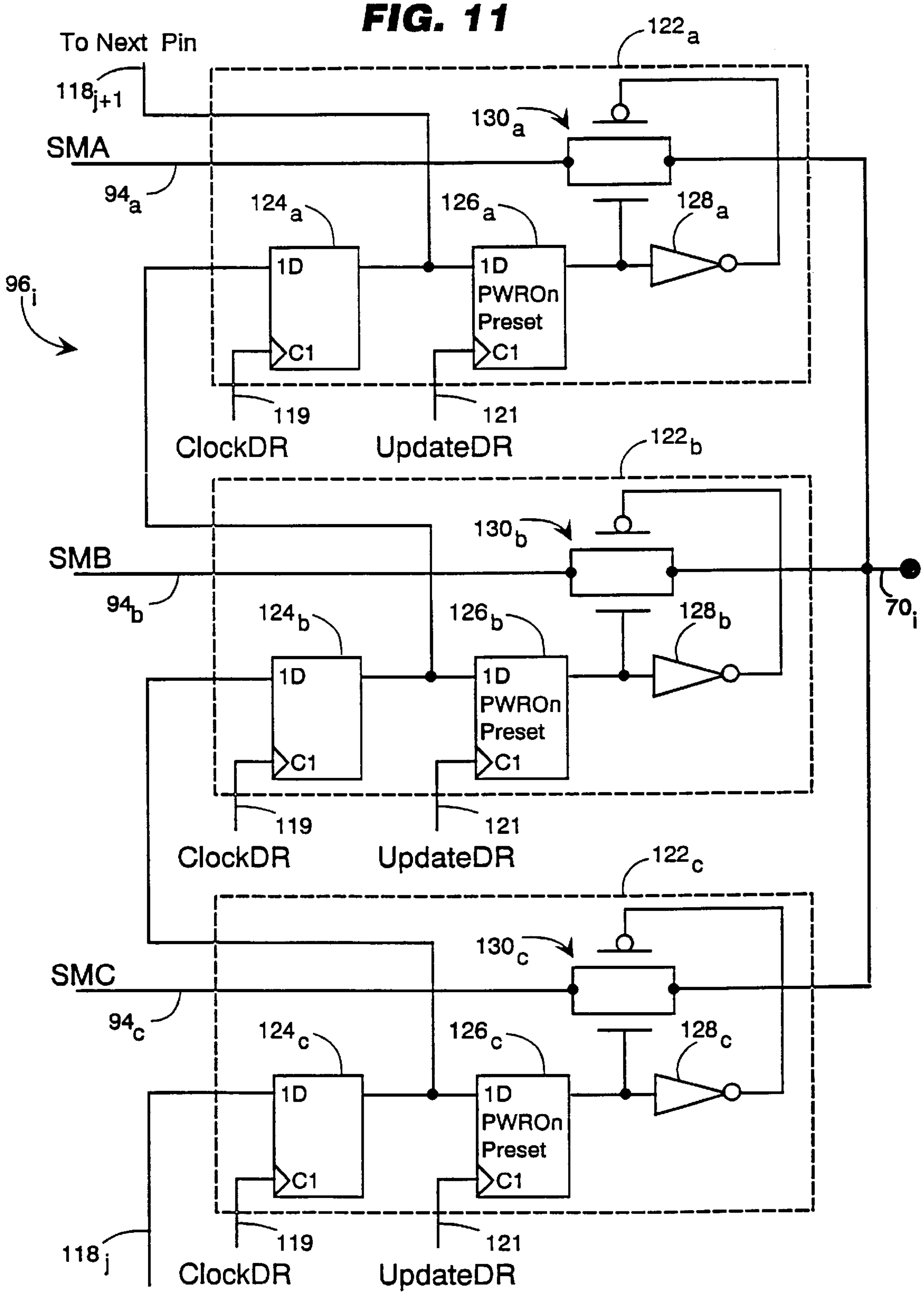
Figure 12:
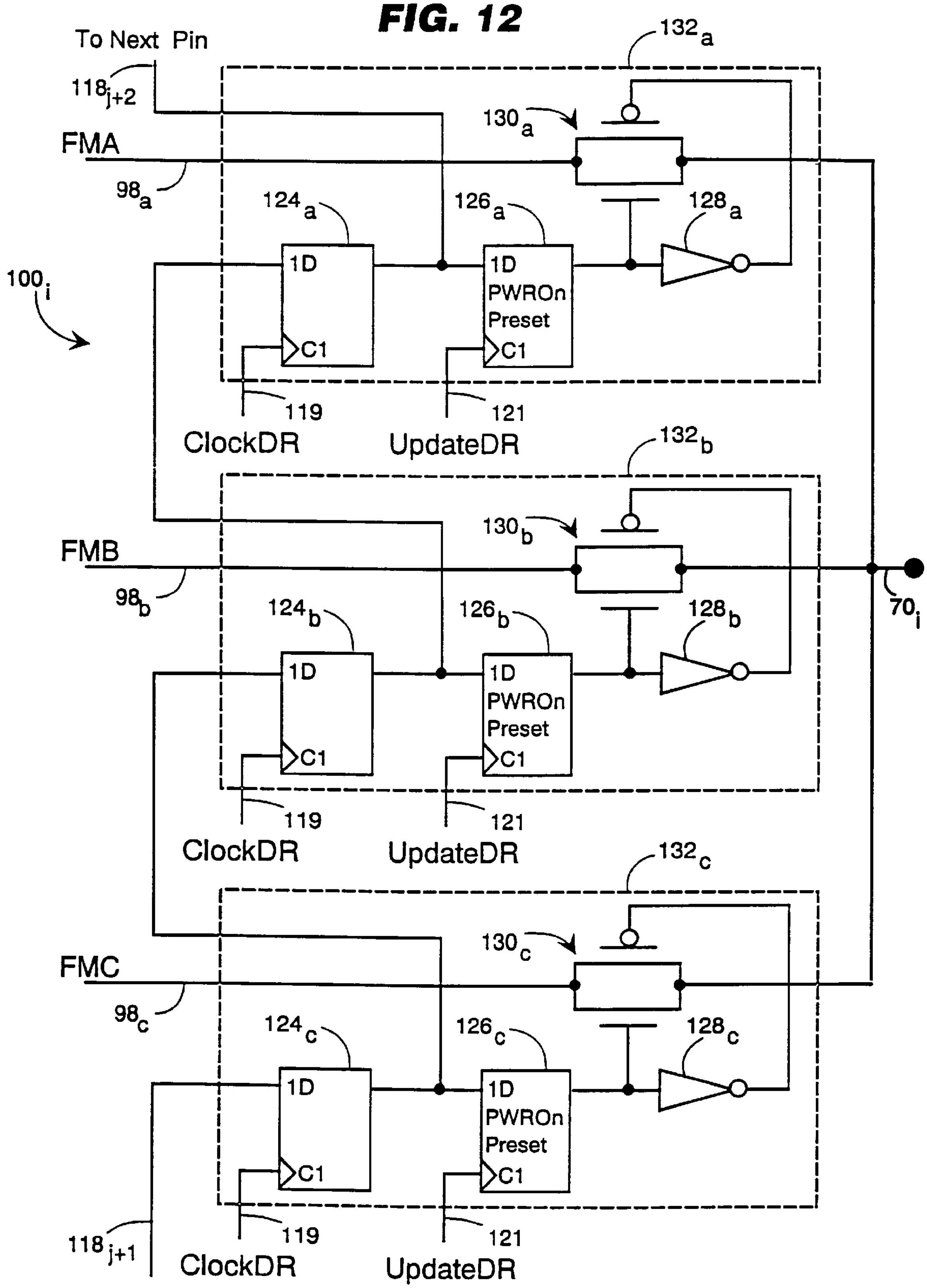

FIGS. 11 and 12 are schematic diagrams of the Force_ Pins and Sense_Pins blocks, respectively, of the I/O Pin Logic circuit.

Figure 13:
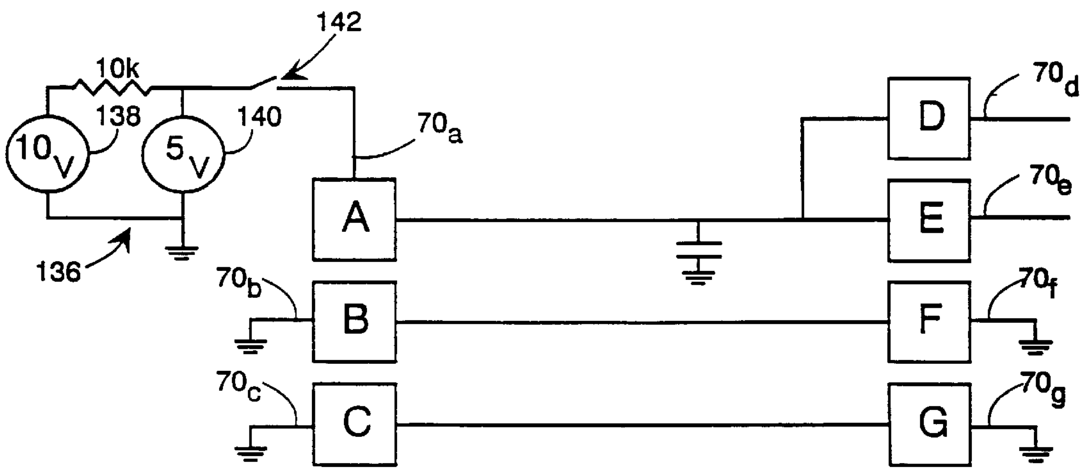

FIG. 13 is a schematic diagram of short and continuity tests performed by the testing apparatus.

Figure 14:
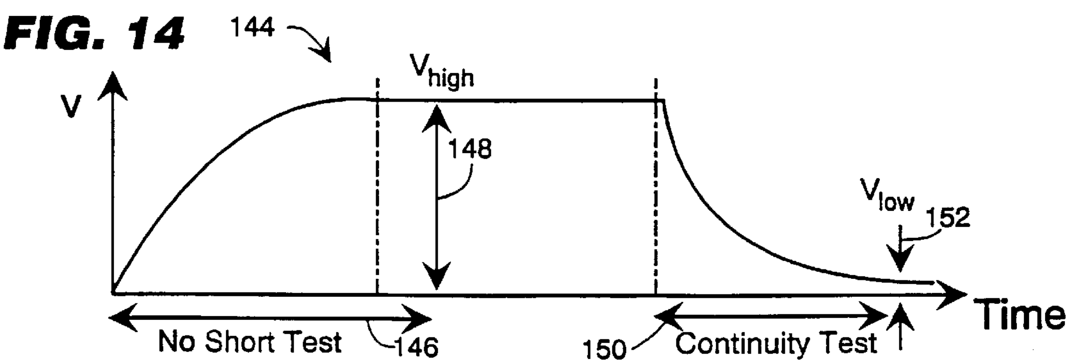

FIG. 14 is a graph of measured voltage for short and continuity tests performed by the testing apparatus.

Figure 15:
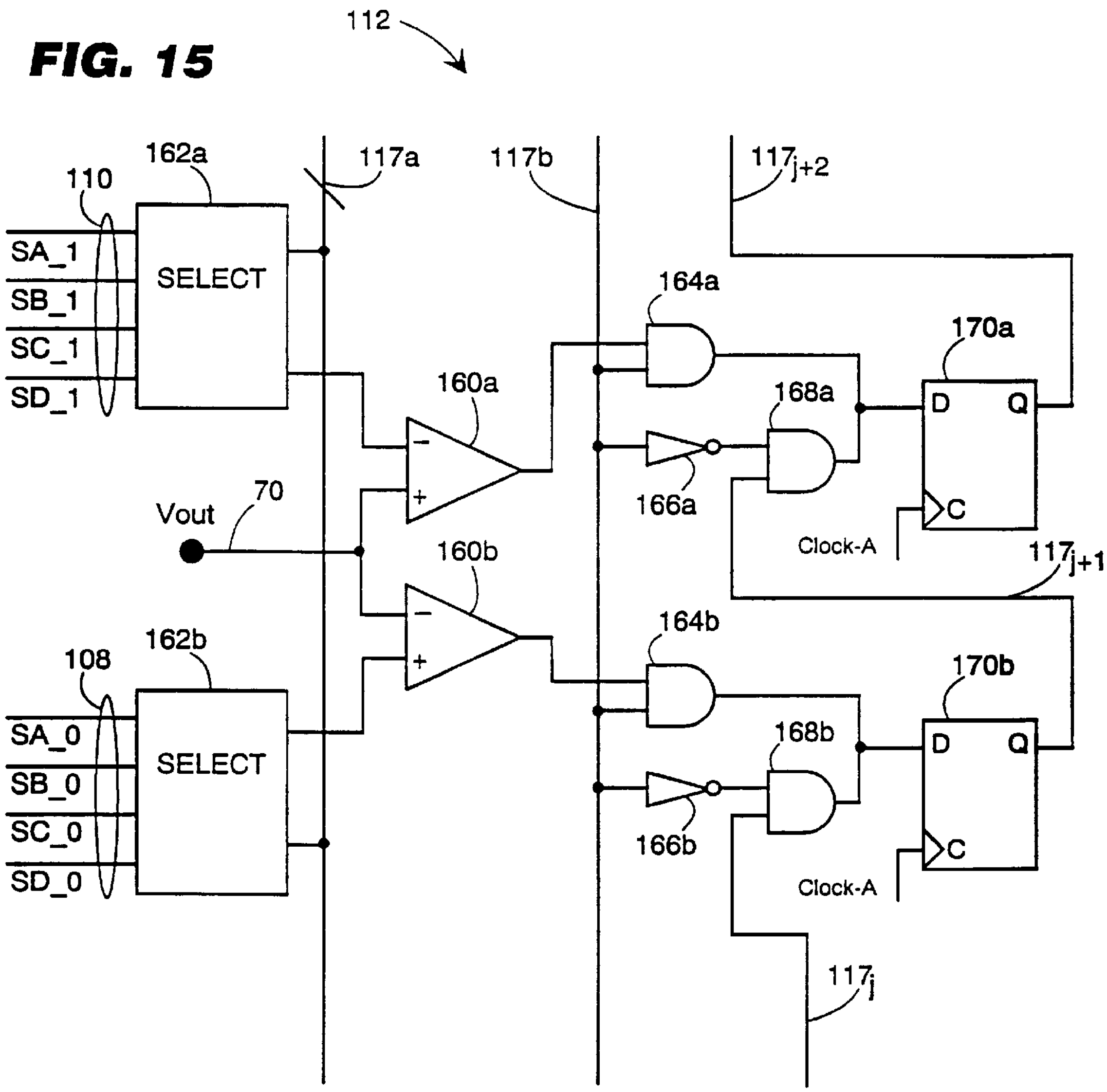

FIG. 15 is a schematic diagram of the Out_Pins block of the I/O Pin Logic circuit.

Figure 16:
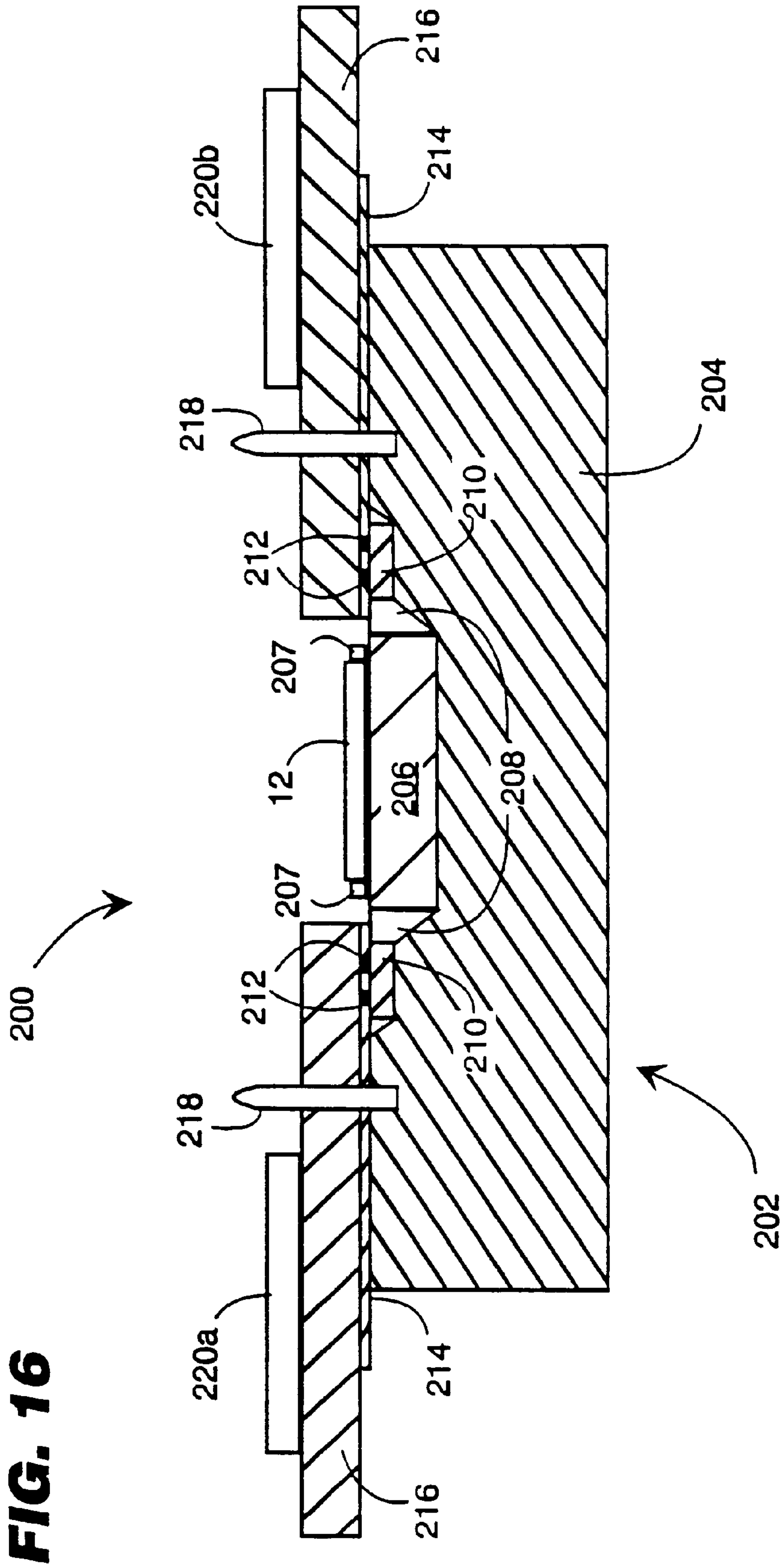

FIG. 16 is a sectional view of an alternate testing assembly.

Figure 1:
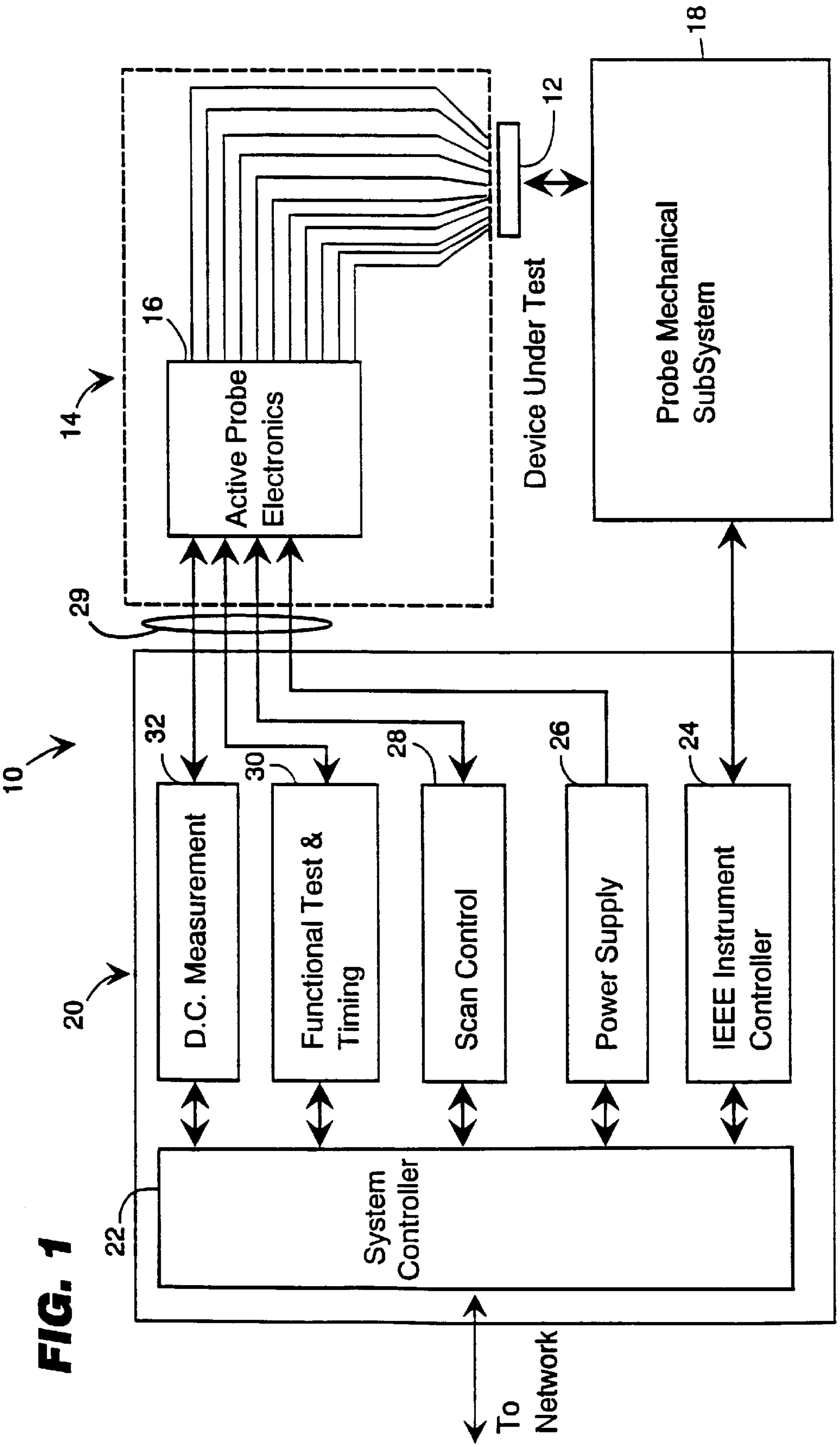
FIG. 1 is a schematic diagram of an active probe testing apparatus.

Referring to FIG. 1, an active probe testing apparatus 10 for testing an electronic device (Device Under Test or DUT) 12 includes a flexible membrane testing assembly 14 (including active probe electronics 16), a probe mechanical subsystem 18, and a test controller 20. The electronic devices 12 (e.g., ICs and/or interconnection substrates) being tested can include ICs arranged in rows and columns on a semiconductor wafer (prior to dicing), or a single such IC after separation from its wafer, or ICs attached to a PCB or MCM interconnection substrate, or a PCB or MCM interconnection substrate alone, before ICs are attached.

For testing, device 12 is brought into contact with the flexible membrane testing assembly 14 by the probe mechanical subsystem 18. Once tested, the probe mechanical subsystem 18 removes the device 12 from the testing apparatus 10.

The test controller 20 may be an industry-standard low-pin-count IC/board test controller (e.g., model 82000, available from Hewlett-Packard). Such controllers typically include a system controller 22 that communicates to an external computer network for downloading testing protocols and uploading final testing data for each device tested. The system controller 22 in turn communicates with: an IEEE-standard instrument controller block 24 that governs the operation of the probe mechanical subsystem 18, and a power supply 26 that powers the active probe electronics 16 for testing each device 12. The system controller 22 also communicates with the combination of a scan control unit 28, a functional test and timing unit 30 and a D.C. measurement unit 32 which together (as described below) control the tests performed by the active probe electronics 16. The test controller 20 communicates with the active probe electronics through bus lines 29.

Figure 2:
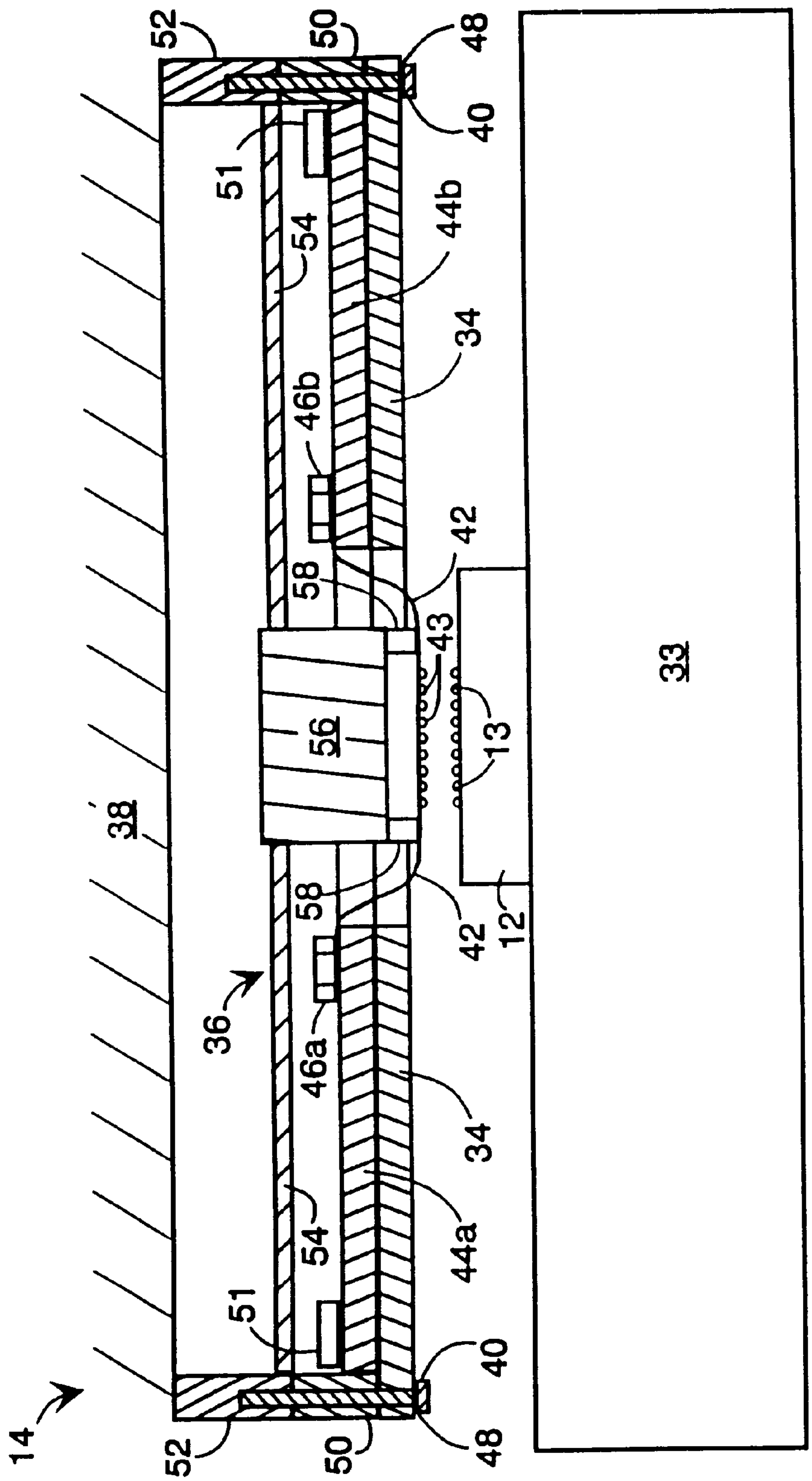
FIG. 2 is a sectional view of a flexible membrane testing assembly.

Referring to FIG. 2, the flexible testing membrane assembly 14 is shown in cut-away above a sample electronic device 12 to be tested. Device 12 has electrical connection pads or nodes 13 on its surface.

The flexible membrane assembly 14 includes a circular membrane probe card 34 and a pressure mechanism 36, both of which are attached to a housing 38. Pressure mechanism 36, as described further below, maintains a suitable contact force between the pads 13 of device 12 and conductive circuit connection bumps 43 exposed on a membrane 42 of membrane probe card 34. Circuit connection bumps 43, which are arranged in accordance with the locations of the pads 13 of the electronic device 12 under test, electrically connect to switching circuits 44*a* and 44*b* on either side of membrane probe card 34 through connectors 46*a* and 46*b* respectively. Switching circuits 44*a* and 44*b* connect electrically through connectors 51 to the test controller 20, and together comprise the active probe electronics block 16 (of FIG. 1). The fabrication of the membrane 42 and circuit connection bumps 43 are described in U.S. patent application Ser. No. 08/303,498, incorporated by reference.

Vacuum chuck 33 (part of the probe mechanical subsystem 18) firmly grips device 12 underneath the flexible membrane assembly 14, allowing lateral movement with respect to the flexible membrane 42 to orient the electrical pads 13 of device 12 with the circuit connection bumps 43. When the electrical pads 13 are properly aligned under circuit connection bumps 43, vacuum chuck 33 is moved vertically with respect to housing 38, forcing the electrical pads 13 into electrical contact with circuit connection bumps 43. The tester 20 can then exchange signals with, provide power to, and evaluate the performance of device 12.

Membrane probe card 34 and pressure mechanism 36 are held fixed with respect to housing 38 by fixture screws 40 installed into mounting holes 48 disposed at uniform circumferential intervals around the outer edge of membrane probe card 34. Screws 40 pass through a frame ring 50 of pressure mechanism 36, and mate with threads in a concentric fixture ring 52 attached to housing 38.

Pressure mechanism 36 includes flexible beam springs 54, each of which is cantilevered at one end from frame ring 50, and at the other end from a pressure block 56. Pressure block 56 mounts to a probe frame 58 bonded to the center of membrane 42. When vacuum chuck 33 forces the electrical pads 13 up into contact with circuit connection bumps 43, beam springs 54 flex, allowing the pressure block 56 and probe frame 58 to move vertically. The compliance of beam springs 54 is selected so that the contact force between the electrical pads 13 and circuit connection bumps 43 is sufficient to ensure reliable electrical interconnection between the two, but not so great as to risk damage to either.

Referring to FIGS. 3–6, membrane 42, together with rectangular probe frame 58 and the rectangular connector frames **46*a* and 46*b*, comprise a membrane assembly 60. Probe frame 58 encloses an open region 62, spanned by the central portion of membrane 42** as would be a drum head.

Figure 3:
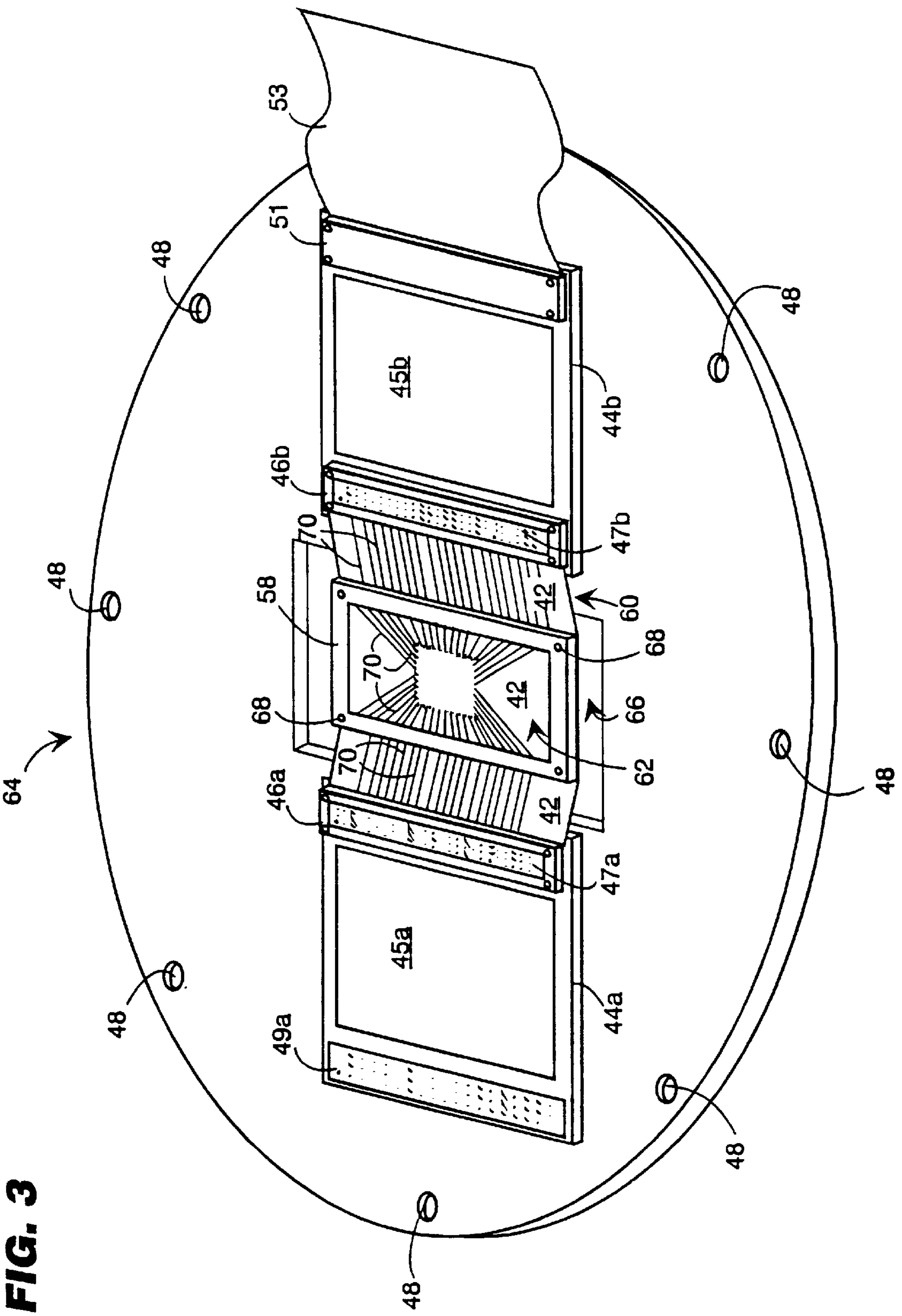
FIG. 3 is a perspective view of a membrane probe card of the testing apparatus.

Connector frames **46*a* and 46*b* attach the ends of membrane assembly 60 to respective switching circuits 44*a* and 44*b*, at membrane connection pad arrays 47*a* and 47*b* (see FIG. 5). Switching circuits 44 can comprise multi-chip modules (MCMS) having ICs 45, as described in more detail below. These MCM switching circuits 44 are bonded to a circular printed circuit board (PCB) 64, which is the main supporting component of probe card 34. MCM switching circuits 44 also have tester connection pad arrays 49*a* and 49*b* for electrical connection to the test controller 20 (lines 29 in FIG. 1). This can be accomplished through a set of pin grid array (PGA) pins 49, which can be connected in several ways. As shown in FIG. 3, a flexible conductor 53 can be attached to the PGA pins 49 through connector 51. Or the PGA pins 49 can connect downward directly into the PCB 64, into signal traces that communicate the signals to the test controller 20**.

The membrane assembly 60 is so arranged that it hangs in the middle of a rectangular hole 66 cut into PCB 64. Because membrane 42 is longer than the width of hole 66, probe frame 58 can move vertically with respect to connector frames **46*a* and 46*b*, and PCB 64. When probe frame 58 is at its lowest point of travel,. membrane 42 is roughly U-shaped in cross-section (FIG. 4*b*). Four holes 68, one in each corner of probe frame 58, accept screws (not shown) for mounting probe frame 58 to pressure block 56 (FIG. 2) of pressure mechanism 36**.

In FIG. 6, circuit connection bump pads 43 are grouped on the portion of membrane 42 that spans open region 62 of probe frame 58, and are organized to correspond to the electrical pads 13 of device 12 being tested. While shown (for simplicity) in an open square pattern, the circuit connection bumps can be arranged in any pattern required. In addition, two sets of membrane connection bumps 72 are arranged, in row-and-column matrices, on the portions of the membrane 42 that span open regions **74*a* and 74*b* of connector frames 46*a* and 46*b*, respectively. The organization of these membrane connection bumps 72 correspond to the membrane connection pad arrays 47*a* and 47*b* of MCM switching circuits 44*a* and 44*b* respectively. A typical arrangement for the membrane connection bumps 72 comprises 6000 membrane connection bumps in a 30 by 200 matrix, each separated from the other by 0.015", allowing for 6000 separate signal runs 70 to circuit connection bump pads 43. (For simplicity, not all signal runs 70 are shown). Furthermore, not all 6000 membrane signal runs 70** need to be used in a particular design.

Each signal run 70 extends from a point directly above a circuit connection bump 43 within the center of probe frame 58 to a point directly above a corresponding membrane connection bump pad 72 within the center region of one of connector frames 46. (For clarity, signal runs 70 are shown solid—not in phantom—in FIG. 6, although in reality signal runs 70 do not lie in the same plane as bump pads 43 and 72.) A via (not shown) at each end of each signal run 70 connects the signal run 70 to the corresponding bump pads 43 and 72 located directly below the signal run at its ends. Signal runs 70, connection bumps 43 and 72, and vias can be fabricated through conventional photolithographic techniques onto membrane 42. By connecting the bump pads 72 to the pad arrays 47 on the MCM, membrane-to-thin-film connections are used to transfer dense collections of signals.

Just as the membrane connection pad arrays 47 (of the switching circuits 44) link to the membrane connection bumps 72 of membrane assembly 60, so do the tester connection pad arrays 49 (FIG. 5) link the switching circuits 44 to the test controller 20. Each tester connection pad array 49 comprises typically 360 electrical connection pads (or PGAs as described) organized in a 6 by 60 staggered matrix separated by 0.100". The switching circuits 44 thereby serve to link approximately 360 incoming tester signal lines with the approximately 6000 signal runs 70 that connect to the device 12 under test. Depending on the application, the number of interconnect pins 49 can vary from a few pins to a few hundred pins.

The structure and operation of the switching circuits 44 is illustrated in FIGS. 7 through 15. Each switching circuit 44 contains M control chips 76 (numbered $\mathbf{76}_1$ through $\mathbf{76}_M$ for convenience). M is a function of how many signal runs 70 are needed to test a given device (e.g., how many signal pads are on the DUT 12) and the number N of separate signal run I/O channels incorporated into each control chip $\mathbf{76}_i$. All control chips $\mathbf{76}_i$ of a given switching circuit 44 connect in parallel to the same incoming tester signal bus lines 80. These incoming tester signal lines connect to the pads of tester connection pad array 49. Each control chip $\mathbf{76}_i$ connects to N signal runs 70 that eventually connect (via circuit connection bumps 43) to device 12 under test. Each switching circuit 44 can therefore control M×N signal lines 70.

Signal line 82 (the Scan_A line) initiates and controls which scanning tests are performed for all signal runs 70 (that is, the scanning test for all pads of the device 12 under test, explained in greater detail below). Both logical/operational testing and DC parametric testing can be separately chosen through the Scan_A line. Signal line 84 (the Scan_B line) controls the scanning test of the Force and Sense channels for all signal runs 70. Signal lines $\mathbf{86}_{A-F}$ provide the measurement lines (for Force and Sense), the reference voltage and the comparator strobe voltages for all signal runs 70. Signal line 88 (the Control line) provides a mode control signal to each control chip 76. And finally, signal line 89 (the Supply/Bias line) provides the power supply and voltage bias to each control chip 76, enabling each control chip 76 to perform continuity tests in conjunction with the Force and Sense measurements.

Referring to FIGS. 8–12, each control chip 76 comprises a Control Logic block 90 and N I/O Pin Logic blocks $\mathbf{92}_1$ through $\mathbf{92}_N$. The Control Logic block 90, shown in detail in FIG. 9, comprises two IEEE standard 1149.1 tap controllers 94*a* and 94*b* and a mode controller 96. The Control Logic block provides boundary scan control signals to the I/O Pin Logic blocks 92. The two tap controllers 94*a* and 94*b* accept industry-standard input signals grouped as Scan_A and Scan_B respectively, providing control signals to signals 118, 119, 120 and 121 as shown. The remaining connections of the tap controllers 94*a* and 94*b* connect to the logic gates of the I/O Pin Logic blocks 92 in a conventional way. For a more in depth explanation, standard textbooks such as *Principles of CMOS VLSI Design: A Systems Perspective,* 2nd Ed., by Neil H. E. Weste and Kamran Eshraghian, Addison-Wesley Publishing Co., 1993 (especially Chapter 8) can be consulted.

The mode control block 96 accepts a set of control signals to determine which tests are to be performed. For example, as explained further below, the tests can be continuity/short tests or can be full logical tests of an integrated circuit or MCM. The Mode Control block 96 can be as simple as a pass-through line from a control line to line 116, that either enables or disables separate testing apparatus, and optimizes the scan chain length to reduce test time overhead.

Lines $\mathbf{86}_{A-F}$ are direct pass-through lines. The Power supply and Bias lines can be directly passed through, or can be split into two or more parts: one part can supply power and bias to the circuitry of the active probe electronics 16 and the other part can provide one or more different voltages and biases to the device under test 12. As explained further below, the various logical blocks of each I/O Pin Logic block 92 allow more than one power supply (or bias) voltage to be attached (or compared) at a given signal run 70.

The Control Logic block 90 of Control Chip 76 connects to the N I/O Pin Logic blocks 92 in series, allowing for a serial scan of all N signal runs 70. The circuitry of each I/O Pin Logic block 92 is shown in FIGS. 10–12. Bus lines $\mathbf{86}_A$–$\mathbf{86}_F$ are connected in parallel to each I/O Pin Logic block. Bus line $\mathbf{86}_A$ (comprising 3 lines SMA, SMB and SMC, or $\mathbf{94}_{A-C}$) connects to the Sense_Pins block 96. Bus line $\mathbf{86}_B$ (comprising 3 lines FMA, FMB and FMC, or $\mathbf{98}_{A-C}$) connects to the Force_Pins block 100. Bus lines $\mathbf{86}_C$ and $\mathbf{86}_D$ (comprising 8 lines, RA_0 to RD_0 (lines 102) and RA_1 to RD_1 (lines 104)) connect to the In_Pins block 106. Bus lines $\mathbf{86}_E$ and $\mathbf{86}_F$ (comprising 8 lines, SA_0 to SD_0 (lines 108) and SA_1 to SD_1 (lines 110)) connect to the Out_Pins block 112. I/O Pin Logic block 92 also contains an I/O Decode block 114 as shown.

Separate lines 116, 117, 118 and 120 connect the Sense_Pins block 96, the Force_Pins block 100, the In_Pins block 106, the Out_Pins block 112 and the I/O Decode block 114 as shown. Each I/O Pin Logic block $\mathbf{92}_i$ connects to a unique signal run $\mathbf{70}_i$ that connects, via circuit connection bump $\mathbf{43}_i$ to a pad $\mathbf{13}_i$ on the device 12 under test.

The I/O Pin Logic block $\mathbf{92}_i$ shown in FIG. 10 provides different sets of circuit blocks for performing different tests for each pad 13 of a device under test 12. The Sense_Pins and Force_Pins blocks 96 and 100 provide testing apparatus for testing interconnections and shorts, as described below and for D.C. parametric measurements. The Out_Pins and In_Pins blocks 112 and 106 provide apparatus for testing the logical functioning of each pad 13. The Mode Control block 96 determines globally which set of tests are enabled and disabled through line 116. Thereby the same apparatus provides for enormously flexible testing of both interconnections and logical operations with the same generalized circuitry.

Depending on the application, the control chips 44 can be designed to test either an active component or an interconnect substrate. The In_Pins block 116 in FIG. 10 is designed to set the pin $\mathbf{70}_i$ to a specific voltage by connecting it to the selected voltage rails of $\mathbf{86}_c$ and $\mathbf{86}_D$. Similarly, if the pin of device 12 connected to $\mathbf{70}_i$ is a device output pin, then In_pins block 116 will be disabled and Out_pins block 112 will be enabled. The Out_Pins block will then read the data present at pin $\mathbf{70}_i$, and compare it to a strobe reference voltage selected from rails $\mathbf{86}_E$ and $\mathbf{86}_F$.

Pin-by-pin selection of whether to use the In_Pins or Out_Pins block is made through the bit pattern scanned into the I/O Decode block 114 connected to the Scan A line through 1149.1 Tap Controller 94*a*. Hence, Scan_A is used to tell each I/O Pin Logic block 114 what test it is performing and which logic block of FIG. 10 to select for a particular test. While the Mode Control block 96 can globally select between the Out_Pins/In_Pins logic set and the Force_Pins/Sense_Pins logic set, use of the Scan_A line (through the I/O Decode block 114) can select different sets pin-by-pin. This can be useful when simultaneously testing certain device nets for continuity and other device nets for their logical functioning. Once logical testing has been turned off for signal run $\mathbf{70}_i$, Scan_B is then used to select which lines of $\mathbf{86}_{A\ \&\ B}$ (through the Force_Pins and Sense_Pins blocks 96 and 100) to connect to $\mathbf{70}_i$ for continuity testing and D.C. parametric measurements.

Referring to FIG. 11, each Sense_Pins block $\mathbf{96}_i$ comprises three identical Sense_Pins sub-blocks 122, that each include two flip-flop circuits 124 and 126 connected in series, an inverter 128 and a P-N MOSFET transistor pair 130. As seen in FIGS. 10 and 11, signal line $\mathbf{118}_{i+j}$ connects the Sense_Pins block $\mathbf{96}_i$ to the next Force_Pins block $\mathbf{100}_i$. The three lines SMA, SMB and SMC ($\mathbf{96}_A$, $\mathbf{96}_B$ and $\mathbf{96}_c$) allow the node $\mathbf{70}_i$ to be connected to any of the three Sense lines, allowing use of multiple external measurement units for parallel testing of connections. These individual lines are switched on or off depending upon whether their respective flip-flops 126 are on or off, via respective transistor pairs 130 and inverters 128 ("pass-through gates").

Referring to FIG. 12, each Force_Pins block $\mathbf{100}_i$ (just like each Sense_Pins block $\mathbf{96}_i$) comprises three identical Force_Pins sub-blocks 132, that each include two flip-flop circuits 124 and 126 connected in series, an inverter 128 and a MOSFET transistor pair 130. As seen in FIGS. 10 and 12, signal line $\mathbf{118}_{j+2}$ connects the Force_Pins block $\mathbf{100}_i$ to the next Sense_Pins block $\mathbf{96}_{i+1}$. Just as with the Sense_Pins block, the three lines FMA, FMB and FMC ($\mathbf{98}_A$, $\mathbf{98}_B$ and $\mathbf{98}_c$) allow three different voltages to be attached to node $\mathbf{70}_i$. These individual lines are switched on or off depending upon whether their respective flip-flops 126 are on or off, via respective transistor pairs 130 and inverters 128 (also "pass-through gates").

The Sense_Pins and Force_Pins blocks $\mathbf{96}_i$ and $\mathbf{100}_i$ cooperate to allow conventional 4-Point circuit measurements for each net under test. For example, the Sense_pins and Force_Pins block for one node i can be used for the Force High and Sense High channels, while the Sense_Pins and Force_Pins blocks for another node j (connected to node i to form a net) can be used for the Force Low and Sense Low channels for the test.

All Sense_Pins and Force_Pins blocks $96_i$ and $100_i$ are connected in serial by line 118. The ClockDR signal line 119, from the 1149.1 Tap Controller 94 (FIG. 9), controls the serial flow of digital signals through all the nodes i. Thus, a given pattern of which nodes will be tested and which channels for which nodes (for example, SMA, SMB or SMC, or FMA, FMB or FMC) will be turned on can be rapidly switched through blocks $96_i$ and $100_i$ by repetitively strobing the ClockDR line 119. Once the right pattern of high and low signals are placed into each respective first flip-flop 124, the UpdateDR line 121 (also from the 1149.1 Tap Controller 94) transfers the output of the first flip-flop 124 into the second flip-flop 126 for each line of each node $70_i$. For example, clocking 100100 into the Sense_Pins block $96_i$ and the successive Force_Pins block $100_i$ of a single node $70_i$ (by strobing ClockDR line 119 six times), then enabling the UpdateDR line 121, transfers the 100100 pattern into successive second flip-flops 100. This pattern would turn on the FMA and SMA lines connected to node $70_i$ and turn off the FMB, FMC and SMB, SMC lines. In this way, complicated mappings of the nodes to be tested at each test cycle can be clocked rapidly through the switching circuitry 16 of the present invention. Further, by these means, a small number of incoming signal lines can access a large number of signal runs 70.

Standard 4-point measurement tests can be time consuming. If less accuracy is desired (for instance, during circuit mass-production, once an assembly line has been accurately calibrated), the invention can be used to perform quicker, but less accurate tests of the circuitry. FIGS. 13 and 14 show even quicker modified tests of shorts and continuity. A power supply 136 (for example, comprising a 10 volt power source 138 connected in parallel to a 5 volt clamp to ground 140) connects via switch 142 to a signal run $70_A$. (In the present invention, switch 142 is formed by each I/O Pin Logic block 92 (FIG. 8)). Node A is connected in a net to nodes D and E. All other nodes, through signal runs $70_{B,C,F\ \&G}$ are connected to ground. By switching on the power supply 136 to Node A, and measuring the voltages at that node, shorts and continuity can be easily measured. Either the voltage comparator found in test controller 20 (in the functional Test and Timing block 30) can be employed for making measurements, or special-purpose sophisticated comparators can be used. Also, the rise time and slopes of voltage changes can be measured to measure the capacitance and other transmission line characteristics of circuit nets.

As the power supply is switched on via Force_Pins block $100_A$ attached to signal run $70_A$, the voltage measured at that node can be described by the graph 144 shown in FIG. 14. During the "short" test period 146, the measured voltage should ramp up to a $V_{HIGH}$ 148 typical of a net that is not shorted to ground. During operation, the testing apparatus 10 switches signal line $70_A$ to the proper voltage via the respective Force_Pins block $100_A$ waits a short time for the voltage to ramp up, and then takes the measurement of the voltage through signal run $70_A$, via the Sense_Pins block $96_A$.

The second portion 150 of the voltage graph 144 describes the voltage measurement for continuity. Each node of the net, for example, node D, is connected to ground in turn, and the voltage at node A is again measured after a short relaxation time. The voltage should drop to a $V_{Low}$ 152 that indicates a good connection to ground. Since the relaxation times for $V_{HIGH}$ and $V_{Low}$ are very short, and each signal run 70 can be switched on and off very rapidly by the clocking mechanism of each I/O Pin Logic block 92, a large number of nodes of a device 12 can be checked for shorts and continuity very quickly.

By including three different lines to each signal run via the Sense_Pins and Force_Pins blocks 96 and 100, one switching chip 44 can connect to a variety of different logic families on the same device, or to a variety different semiconductor circuits combined on an MCM. For example, the voltages applied to a silicon substrate, through the SMA, FMA lines, can be different than voltages applied to a gallium arsenide substrate. Since MCMs can now include a variety of such substrates on one module, different appropriate voltages may be selected for each test for each substrate. Furthermore, since the gates of the Force_Pins, Sense_Pins, In_Pins, and Out_Pins blocks are not configured to provide voltage levels appropriate for only a single logic family, but rather to pass through any number of different voltage lines, more than one measurement can be done in parallel, and device pins can be connected to both digital and analog devices.

In FIG. 15, the Out_Pins block 112 consists of two or more comparators that compare an incoming signal from signal run 70 (connected to a pad 13 of the device under test 12) with comparator strobe voltage levels provided by lines 110 and 108 (SA_1—SD_1 and SA_0—AD_0). The comparator strobe voltage levels taken from lines 108 and 110 are determined by signals on bus line 117*a* by Select logic blocks 162*a* and 162*b*. The I/O Decode block 114 (once enabled by the Mode Control block 96) uses codes scanned on signal line 120 to instruct Select block 162*a* which signal of SX_1 to use for the logical high voltage reference, and which signal of SX_0 to use as the logical low voltage reference. If Vout on signal run 70 is logical high, it will be higher than the reference high (from SX_1), and comparator 160*a* will output a logical 1. If Vout on signal run 70 is logical low, it will be lower than the reference low (from SX_0), and comparator 160*b* will output a logical 1.

The outputs of comparators 160*a* and 160*b* (either 1–0 or 0–1) are latched into latches 170*a* and 170*b,* when the I/O Decode block forces line 117*b* high, through AND gate 164. This occurs during sampling periods. Once a sample period ends, and 117*b* goes low, either latch 170*a* or latch 170*b* will be high. Then, by clocking $117_j$, the results of the tests can be clocked back to the I/O Decode block. That is, through invertors 166 and AND gates 168, the output of latch 170*b* will be sent to the AND gate 168*a,* and latched into latch 170*a,* while the output of latch 170*a* is output along $117_{j+2}$. Clock-A, attached to all the Out_Pins blocks 112, is a separate clock that regulates these outputs of the logical tests.

The In_Pins block 106 forces the pad 13 attached to signal run 70 to a voltage level chosen from one of the lines of $86_D$ (again selected by the I/O Decode block 114). These voltages can be selected and passed through in exactly the same manner and with the same apparatus as the Force_Pins block shown in FIG. 12. The In_Pins block then works with the Out_Pins blocks to perform logical and operational testing of circuit nets.

The I/O Decode block 114 determines whether the device pad 13 connected to signal run 70 is to be an input or an output, and what the attached or expected voltage at that node should be. The I/O Decode block 114 cooperates with the In_Pins block 106 and Out_Pins block 112 to provide full logical testing for any integrated circuit device 12.

An alternative testing probe structure 200 is shown in FIG. 16. A device holder 202 comprises a substrate support plate 204 rigidly holding an elastomer block 206 that in turn receives a circuit die 12 (held by fence 207) for testing on the elastomer block surface. Just as with membrane assembly 60, the elastomer block 206 contains imbedded signal runs 70 (not shown) that both communicate with pads 12 (not shown) on the circuit die 12, and communicate via signal runs imbedded on interconnect membranes 208 and electrical button connectors 212 to testing probe card 216, having switching circuits 220*a* and 220*b*. Electrical button connectors 212 are held in place by HDI aluminum donuts 210. Probe card 216 is kept in accurate registration with the device holder 202 by alignment pins 218 and is kept separated by interposer plate 214. Alternative embodiment 200 provides a more rigid version of the testing apparatus of the present invention, where the device under test is inserted into the testing assembly, rather than having the test assembly descend onto the device under test. All other electrical operations of the switching circuitry remain the same.

Other embodiments are within the scope of the following claims. For example, a different number of voltage lines can be used for each switch as needed. The exact method of contacting a device under test can be changed: for example, an IC die can be inserted into a receptacle having the appropriate number of signal runs 70 leading to the switching circuits 44. Different materials can be employed to create the flexible membrane structure for contacting the circuit under test. The multi-chip module switching circuits 44 can be directly fabricated on the membrane 42. In the active probe electronics, more or fewer testing circuits can be employed. Different electrical tests can be incorporated in the same manner. The Mode Control block 96 can be made to operate a number of different testing blocks for the device under test 12. A different number of control blocks 76 and signal runs 70 can be used.

In addition (as shown in FIG. 7), the MCM switching circuits 44 can include a number of identical Control Chips 76 like those already described, so that they operate in parallel governed by one testing vector sent by the test controller 20. That way, a number of identical semiconductor dies can be tested on their wafer at the same time, before removal. The parallel testing circuitry then merely needs to export a "good" or "bad" test indication for each die, allowing bad circuit dies to be winnowed out in a highly cost-effective manner.

What is claimed is:

1. A structure for routing test signals between pads of a device under test and a tester circuit, comprising:

a substrate having contact points, one for each of the pads;

a probe support having a number of conductors for connection to the tester circuit, the number of conductors being fewer than the number of contact points on the substrate, the substrate supported on and removable from the probe support;

switching circuitry for routing the test signals between the conductors and the contact points on the removable substrate, the switching circuitry mounted on the probe support such that, when the substrate is removed from the probe support, the switching circuitry remains coupled to the probe support; and a separable thin-film-to-thin-film_-electrical connection between the switching circuitry and the substrate.

2. The structure of claim 1 wherein the substrate comprises a thin-film membrane, the substrate having contact points on the thin-film membrane, one for each of the pads to be tested.

3. The structure of claim 2 wherein the thin film membrane has a frame enclosing an area where the contact points are located.

4. The structure of claim 1 wherein the switching circuitry includes a locally programmable pass-through gate connecting at least one of the conductors with at least one of the contact points.

5. The structure of claim 4 wherein the pass-through gate allows the connection of an analog electrical signal on the conductor to the contact point.

6. The structure of claim 4 further comprising a plurality of locally programmable pass-through gates connecting at least one of the conductors with at least one of the contact points, the plurality of pass-through gates being coupled to the same conductor, to allow connection of substantially the same analog electrical signal carried on the conductor to each of the contact points connected to the plurality of the pass-through gates.

7. The structure of claims 1 wherein the switching circuitry comprises an integrated circuit.

8. The structure of claims 1 wherein the switching circuitry comprises a multichip module including integrated circuits.

* * * * *

UNITED STATES PATENT AND TRADEMARK OFFICE

CERTIFICATE OF CORRECTION

PATENT NO. : 5,973,504

DATED : OCTOBER 26, 1999

INVENTOR(S) : FU CHIUNG CHONG

It is certified that error appears in the above-identified patent and that said Letters Patent is hereby corrected as shown below:

Cover Page 1, Abstract (10th line down)
Delete "a method routes" and insert --the invention features a method for routing--.

Cover Page 2, U.S. Patent Documents (column 2) in the reference "Kister....324/754"
Delete "1995" and insert --1996--.

Column 12, Line 18, before "electrical"
Delete "___".

Signed and Sealed this

Third Day of April, 2001

*Attest:*

Nicholas P. Godici

NICHOLAS P. GODICI

*Attesting Officer*

*Acting Director of the United States Patent and Trademark Office*